US006440331B1

(12) United States Patent
Carano et al.

(10) Patent No.: US 6,440,331 B1
(45) Date of Patent: Aug. 27, 2002

(54) AQUEOUS CARBON COMPOSITION AND METHOD FOR COATING A NON CONDUCTIVE SUBSTRATE

(75) Inventors: Michael V. Carano; Frank Polakovic, both of Plymouth, MN (US)

(73) Assignee: Electrochemicals Inc., Maple Plain, MN (US)

( * ) Notice: Subject to any disclaimer, the term of this patent is extended or adjusted under 35 U.S.C. 154(b) by 0 days.

(21) Appl. No.: 09/325,072

(22) Filed: Jun. 3, 1999

(51) Int. Cl.⁷ .............................. H01B 1/06; H01B 1/04
(52) U.S. Cl. ....................................... 252/506; 252/503
(58) Field of Search ................................ 205/125, 157, 205/159, 164, 920; 252/503, 506

(56) References Cited

U.S. PATENT DOCUMENTS

| | | | | |
|---|---|---|---|---|
| 4,052,641 A | * | 10/1977 | Dominick et al. ........... | 313/450 |
| 4,619,741 A | | 10/1986 | Minten et al. ................ | 204/15 |
| 4,818,438 A | * | 4/1989 | Wiley ........................... | 252/511 |
| 4,826,631 A | * | 5/1989 | Sullivan ....................... | 252/512 |
| 5,139,642 A | | 8/1992 | Randolph et al. ........... | 205/125 |
| 5,151,222 A | * | 9/1992 | Ruffoni ........................ | 252/511 |
| 5,389,270 A | | 2/1995 | Thron et al. .................. | 252/22 |
| 5,476,580 A | | 12/1995 | Thorn et al. ................. | 205/122 |
| 5,632,927 A | * | 5/1997 | Ferrier et al. ................ | 252/62.2 |
| 5,681,885 A | * | 10/1997 | Kinoshita et al. ........... | 524/430 |
| 5,725,807 A | | 3/1998 | Thorn et al. ................. | 252/510 |
| 5,908,585 A | * | 6/1999 | Shibuta ........................ | 252/506 |
| 5,919,349 A | | 7/1999 | Huber et al. ................. | 205/413 |
| 6,037,020 A | * | 3/2000 | Garlough et al. ........... | 427/600 |
| 6,086,790 A | * | 7/2000 | Hayashi et al. .............. | 252/500 |

FOREIGN PATENT DOCUMENTS

JP        50-006717 A   *  1/1975

OTHER PUBLICATIONS

Lea, et al., Blowholing in PTH Solder Fillets Assessment of the Problem (Part 1) *Circuit World* 12(*4*):14–19 (1986), no month available.
Lea, et al., Blowholing in PTH Solder Fillets The Nature, Origin and Evolution of the Gas (Part 2) *Circuit World* 12(*4*):1–25 (1986), no month available.
Lea, et al., "Blowholing in PTH Solder Fillets Moisture and the PCB," (Part 3) *Circuit World* 12(*4*):26–33 (1986), no month available.
Lea, et al., "Blowholing in PTH Solder Fillets The Plated Copper Barrel," (Part 4) *Circuit World* 13(*1*):28–34 (1986), no month available.
Lea, et al., "Blowholing in PTH Solder Fillets The Role of the Electroless Copper," (Part 5) *Circuit World* 13(*1*):35–42 (1986), no date available.
Lea, et al. "Blowholing in PTH Solder Fillets The Laminate, The Drilling and Hole Wall Preparation," (Part 6) *Circuit World* 13(*1*):43–50 (1986), no date available.
Lea, et al., "Blowholing in PTH Solder Fillets Optimising the Soldering," (Part 7) *Circuit World* 13(*2*):42–45 (1987), no month available.
Lea, et al., "Blowholing in PTH Solder Fillets The Scientific Framework Leading to Recommendations for Its Elimination," (Part 8) *Circuit World* 13(*3*):11–20 (1987), no month available.
Lea, "The Harmfulness of Blowholes in PTH Soldered Assemblies," *Circuit World*, 16(4):23–28 (1990), no month available.
"Zelec® ECP electroconductive powders," DuPont, 4 pages (Sep. 1995).

* cited by examiner

*Primary Examiner*—Edna Wong
(74) *Attorney, Agent, or Firm*—McAndrews, Held & Malloy, Ltd.

(57) ABSTRACT

A composition and method for applying an electrically conductive coating to an initially electrically nonconductive surface, such as a printed wiring board having through holes is disclosed. The method is carried out by applying a composition of electrically conductive carbon particles, a second conductive material, a water dispersible binding agent, and an aqueous dispersing medium to a nonconductive substrate to form a substantially continuous, electrically conductive coating. Enough of the carbon particles are present to provide an electrically conductive coating when the composition is applied to the substrate. Enough of the second conductive material is present to provide an improved electrically conductive coating when the composition is applied to the substrate. The resulting coating carbon coating has an improved conductivity over prior through hole coating compositions and processes and is capable of being exposed to molten solder without resulting in the formation of blowholes.

47 Claims, No Drawings

AQUEOUS CARBON COMPOSITION AND METHOD FOR COATING A NON CONDUCTIVE SUBSTRATE

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present invention generally relates to a composition and method for making an initially electrically nonconductive surface electrically conductive by applying an electrically conductive coating from an aqueous carbon dispersion. One aspect of the present invention relates more particularly to such a method for making the initially nonconductive through hole and via walls of printed wiring boards electrically conductive, so they can be electroplated. ("Via" as used herein refers either to a through hole or to an open or blind via, however formed. Vias and through holes can be formed by drilling, by laser or plasma ablation, additively (as from a photoresist), or in any other way presently known or discovered in the future.)

Conductive graphite and carbon black aqueous dispersions are used to provide a conductive coating on via walls and other nonconductive surfaces. Such dispersions, methods for using such dispersions to coat vias, and improved printed wiring boards fabricated by using such dispersions are defined in U.S. Pat. Nos. 5,476,580, 5,389,270, and 5,725,807 respectively issued to Thorn et al. on Feb. 14, 1995, Dec. 19, 1995, and Mar. 10, 1998. These patents referred to in the preceding sentence are incorporated herein by reference in their entireties. A graphite composition, cleaners, conditioners, and other materials and directions needed to practice these patents are available under the trademark SHADOW(& from Electrochemicals Inc., Maple Plain, Minn. Other carbon dispersions containing carbon black or graphite are described, for example, in U.S. Pat. No. 5,139,642.

A problem with the current electroless plating processes is that "blowholes" occasionally develop after the via wall has received a conductive coating, has been electroplated with copper, and is then suddenly heated, as by contacting it with molten solder. (Soldering is carried out by coating the via walls and other conductive surfaces of a printed wiring board with hot, molten metal to make electrical connections by wetting and filling the spaces between the conductive via surfaces and the leads of electrical components which have been inserted through the vias. A properly soldered via is filled with solder.) If there are any gaps or voids in the plated copper in the via, moisture can enter the substrate through the gaps. Soldering heats the plated via walls very quickly. The hot solder rapidly vaporizes any moisture in the substrate, which can blow some or all of the solder out of the hole and breach the copper layer. The result is a blowhole or a partially filled or empty hole, any of which is counted as a soldering defect.

The problem of blowholes in vias made electrically conductive by electroless plating, and the solution to blowholes when that technology is used, are described in a series of articles published in CIRCUIT WORLD, Vol. 12 No. 4 (1986), Vol. 13 No. 1 (1986), and Vol. 13 Nos. 2–3 (1987), under the common title, *Blowholing in PTH Solder Fillets*. A related article is C. Lea, *The Harmfulness of Blowholes in PTH Soldered Assemblies*, CIRCUIT WORLD, Vol.16, No.4, (1990). All the articles in this paragraph are incorporated herein by reference in their entirety for their discussion of blowholes in electroless copper technology.

Recently, the present inventors have discovered that blowholes can occasionally be a problem for vias that have been made conductive, to facilitate electroplating, by applying certain aqueous carbon-based conductive compositions. Thus, a need has arisen to solve the problem of blowholes when a carbon-based conductive coating is used to make via walls electrically conductive to facilitate electroplating.

One alternative method for reducing the formation of blowholes is with ultrasonic treatment of the carbon dispersion, the conditioner bath, or other treatment baths used to prepare for and deposit the conductive carbon coating. This method has solved the blowhole problem for many applications.

Another continuing challenge is how to increase the conductivity of the carbon coating that is deposited on the nonconductive surface. The graphite compositions disclosed in the Thorn et al. patents cited above provide coatings with markedly improved conductivity, which results in faster electroplating and provides other benefits. For some applications, however, further improvements in conductivity would be useful.

BRIEF SUMMARY OF THE INVENTION

One object of the present invention is a conductive coating that can be deposited on a non-conductive surface to make it electrically conductive.

Another object of the present invention is to provide a conductive carbon coating with improved conductivity over coatings of palladium, electroless carbon, carbon black, or graphite provided by prior through hole coating compositions and processes.

An additional object of the present invention is a process for applying a uniform coating of carbon particles and a second conductive material on a non-conductive surface. As used herein, a "uniform" coating is one essentially free of excess conductive coating buildup so that the coating has a substantially consistent thickness after plating.

Still another object of the present invention is a conductive composition that can be electroplated to a previously non-conductive surface, such as a printed wiring board, and adhere to a through hole wall better than coatings of palladium, electroless carbon, carbon black, or graphite provided by prior through hole coating process and compositions.

A still further object of the invention is to provide a conductive through hole coating which results in the formation of essentially no blowholes when soldered.

One aspect of the invention which satisfies one or more of the foregoing objects is a composition including electrically conductive carbon particles, a second conductive material, a water dispersible binding agent, and an aqueous dispersing medium. Enough of the carbon particles are present to provide an electrically conductive coating when the composition is applied to a substrate. The electrically conductive carbon particles can be, for example, graphite, carbon black, or combinations of the two. Enough of the second conductive material is present to provide an improved electrically conductive coating when the composition is applied to a substrate. The second conductive material can be a substrate coated with a metal, a metal, a metal oxide, or a powder containing tin oxide and antimony. Each metal recited in the preceding sentence can optionally be aluminum or nickel. Enough of the binding agent is present to bind the carbon particles and the second conductive material to the substrate.

Another aspect of the invention is a composition including electrically conductive carbon particles as previously defined, a second conductive material as previously defined, a water dispersible binding agent as previously defined, and an aqueous dispersing medium as previously defined. Enough of the carbon particles and second conductive material are present to provide an electrically conductive coating which can be electroplated to an originally nonconductive printed wiring board surface, resulting in soldering of said surface substantially without blowholes.

Still another aspect of the present invention is a conductive composition stated in terms of the solids found in a coating applied from the compositions described above. The coating includes from about 2.0 to 99.6% by weight of electrically conductive carbon particles and from about 0.4 to 98% of a second conductive material. The second conductive material can be a substrate coated with a metal, a metal powder, or a powder including tin oxide and antimony.

The compositions above can be used to coat a via surface or other nonconductive substrate with an electrically conductive composition to facilitate electroplating. These compositions can be used to coat an electronic equipment housing to dissipate static electricity accumulations. These compositions can be used to provide an opaque, electrically conductive coating on the glass envelope of a television picture tube. Many other uses for these compositions are also known or would be obvious to a person skilled in the art.

The use of a composition of carbon and a second conductive component according to the present invention has been found effective for reducing, and in some instances substantially eliminating, the formation of blowholes. The use of a composition of carbon and a second conductive component can also improve the conductivity of dispersion of the carbon particles in the conductive carbon dispersion.

BRIEF DESCRIPTION OF THE SEVERAL VIEWS OF THE DRAWING

Not applicable

DETAILED DESCRIPTION OF THE INVENTION

While the invention will be described in connection with one or more preferred embodiments, it will be understood that the invention is not limited to those embodiments. On the contrary, the invention includes all alternatives, modifications, and equivalents as may be included within the spirit and scope of the appended claims.

The present invention is carried out by providing or using a conductive carbon dispersion as described in the Summary of the Invention section above. A detailed description of the ingredients of the dispersion and how it is made and used follows.

Carbon

One component of the present conductive composition is electrically conductive carbon, for example, carbon black, graphite, or combinations of the two. Graphite is different from carbon black. Carbon black particles are amorphous. In contrast, graphite particles are highly crystalline. Typically, carbon black particles are impure, frequently being associated with 1–10% volatiles. See U.S. Pat. No. 4,619,741 at col. 7, ln. 5–11. In contrast, graphite is relatively pure, particularly synthetic graphite.

The electrically conductive carbon particles should be present in an amount effective to provide an electrically conductive coating when the composition is applied to a substrate. The carbon may be present as from about 0.1 to about 25% by weight, Alternatively from about 0.1 to about 20% by weight, alternatively from about 0.5 to about 10% by weight, alternatively from about 1 to about 7% by weight, alternatively from about 4 to about 6.5% by weight of the composition.

The carbon may have a mean particle size within the range from about 0.05 to about 50 microns, alternatively from about 0.3 to 1.0 microns, alternatively from about 0.7 to about 1.0 microns. From the perspective of performance and ease of dispersion, particles from the smaller end of the size range are preferred. However, the smaller particles, particularly graphite particles, are more costly. Graphite particles of suitable size can be prepared by the wet grinding or milling of raw graphite, having a particle size greater than 50 microns, to form a slurry of smaller particles. Graphite particles of suitable size can also be formed by graphitizing already-small carbon-containing particles.

The inventors have found it unnecessary to obtain graphite having mean particle sizes substantially less than one micron, contrary to the conventional belief that extremely fine graphite is necessary.

If both carbon black and graphite are used, the carbon black may have a substantially smaller particle size (for example, a sub-micron average diameter) than the graphite (for example, an about one-micron or greater number-average diameter). The ratio of graphite to carbon black may be at least about 1:100, or at least about 1:10, or at least about 1:3, or at least about 1:1, or at least about 3:1, or at least about 6:1, or at least about 10:1, or at least about 20:1, or at least about 50:1, or at least about 100:1, or at most about 1:100, or at most about 1:10, or at most about 1:3, or at most about 1:1, or at most about 3:1, or at most about 6:1, or at most about 10:1, or at most about 20:1, or at most about 50:1, or at most about 100:1, each ratio being a weight-weight ratio.

While not bound by any theory as to why the admixture of carbon black and graphite may be desirable, the inventors submit that graphite and carbon black may be synergistic in the contemplated coating compositions because graphite is more conductive but hard to grind to sub-micron size, while carbon black is normally sub-micron-sized but less conductive. The smaller carbon black particles may lodge and form low-resistance paths in the interstices between the larger graphite particles, thus reducing the interstitial electrical resistance of the coating.

The carbon black useful herein should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.05 to about 3.0 microns, more preferably from 0.08 to about 2.0 microns, when in said dispersion. The term "average particle diameter" as employed herein as to carbon black particles in both the specification and claims refers to average mean diameter of the particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks. However, it is preferred to utilize carbon blacks which are initially acidic or neutral, i.e., those which have a pH of between about 1 and about 7.5 and more preferably between about 2 and about 4 when slurried with water. Carbon black particles of the preferred type contain between about 1% and about 10% by weight of volatiles and have an amorphous structure.

These preferred carbon black particles are also very porous and generally their surface areas are from between about 45 to about 1,100, and preferably between about 300 to about 600, square meters per gram as measured by the BET method (method of Brunauer-Emmett-Teller).

Several commercial carbon blacks, contemplated to be useful herein, include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein should have an average particle diameter below about 1.5 microns while in the dispersion. It is desirable to have this average particle diameter of graphite as small as possible to obtain the desired plating characteristics of substantially even plating and no plating pullaways. Preferably, the average particle diameter of the conductive graphite particles is in the range of about 0.05 to about 0.8 microns. More preferably, the average particle diameter is from about 0.1 to about 0.4 microns. It is also required that the graphite particles retain their crystal structure and, therefore, their conductivity. Thus, if the graphite particles are too large, caution in grinding must be exercised since it is known that grinding can be associated with a loss in conductivity. Therefore, the term "conductive graphite particles" as used in the present specification and claims means graphite particles which have a substantially crystalline structure and are essentially free of crystal defects, thus possessing sufficient conductivity to increase the conductivity of the combined carbon black and graphite deposit.

The term "average particle diameter" as employed herein as to graphite particles in both the specification and claims refers to average mean diameter of the graphite particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, Calif.).

In the present compositions, the graphite may be either synthetic or naturally occurring. Accordingly, suitable commercial graphite and graphite dispersions contemplated to be useful herein include: ULTRAFINE GRAPHITE, sold by Showa Denko K.K., Tokyo, Japan; AQUADAG E; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRA-PHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics.

However, synthetic graphite is preferred. Synthetic graphite is formed by heat treating (graphitizing) a carbon source at temperatures exceeding 2400° C. The most conductive and most preferred graphite (electronic grade) is prepared at very high graphitization temperatures (such as about 3000° Kelvin).

In the present compositions, the conductivity of the carbon is important. When carbon is deposited on the nonconductive surface of a via, it is both the conductivity of the carbon particles and their uniform deposition which enable the carbon deposit, as a whole, to act as a cathode and to receive uniformly electroplated conductive metal layer.

Binding Agent

Another component of some of the present compositions is a water soluble or dispersible binding agent for binding the carbon particles. The binding agent is believed to assist the dispersed conductive particles ("conductive particles" as used herein includes the carbon particles and the second conductor material) in adhering to the surface of the non-conductive (i.e., dielectric) substrate which is to be made conductive for electroplating. The binding agent should be present in an amount effective to bind the conductive particles to a substrate. The binding agent may be present as from about 0% to about 20% by weight of the composition for binding to the conductive particles.

The binding agent is preferably any natural or synthetic polymer, polymerizable monomer, or other viscous or solid material (or precursor thereof) that is capable of both adhering to the conductive particles and of receiving an anionic dispersing agent (as described below). Alternatively, the binding agent can be capable of dispersing the conductive particles to which it adheres in the aqueous medium of the dispersion. For example, the binding agent may be a water-soluble or water dispersible material selected from the group consisting of mono- and polysaccharides (or, more broadly, carbohydrates) and anionic polymers. Typically, for purposes of this invention, a 2% by weight aqueous test solution of the binding agent will have a viscosity within the range of 25–800 cps at 25° C., although other concentrations of the binding agent and other viscosities of the complete through hole coating composition are also contemplated herein.

Monosaccharide binding agents contemplated for use herein include tetroses, pentoses, and hexoses. Polysaccharide (which for the present purposes includes disaccharide and higher saccharide) binding agents contemplate for use herein include sucrose (from beets, sugarcane, or other sources), maltose, fructose, lactose, stachyose, maltopentose, dextrin, cellulose, corn starch, other starches, and polysaccharide gums. Polysaccharide gums contemplated for use herein include agar, arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemicellulose polysaccharides contemplated for use herein include d-gluco-d-mannans, d-galacto-d-gluco-d-mannans, and others. Anionic polymers contemplated herein include the alkylcelluloses or carboxyalkylcelluloses, their low- and medium-viscosity alkali metal salts (e.g. sodium carboxymethylcellulose, or "CMC"), cellulose ethers, and nitrocellulose. Examples of such anionic polymers include KLUCEL hydroxypropylcellulose; AQUALON CMC 7L sodium carboxymethylcellulose, and NATROSOL hydroxyethylcellulose, which are all commercially available from Aqualon Company of Hopewell, Va.; ethylcellulose, available from Hercules of Wilmington, Del.; METHOCEL cellulose ethers, available from Dow Chemical Co., Midland, Mich.; and nitrocellulose, which is also available from Hercules.

The acrylics contemplated herein for use as binding agents include polymerizable monomers and polymers, for example, emulsion polymers commonly known as acrylic latices. The monomers include acrylamide, acrylonitrile, acrylic acid, methacrylic acid, glycidyl methacrylate, and others. The acrylic polymers include polymers of any one or more of the foregoing monomers; polyacrylamide polymers such as SEPARAN NP10, SEPARAN MGL, SEPARAN 870, and SEPARAN MG200 polymers; polyacrylic acid; acrylic ester polymers such as polymethyl acrylate, polyethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobomyl acrylate; and other polyacrylates. Suitable acrylics available to the trade include NALCO 603, PURIFLOC C31, and ACRYSOL acrylics sold by Rohm and Haas Company of Philadelphia, Pa.

Other binding agents are also contemplated herein. The vinyl resins contemplated herein include polyvinyl acetates, polyvinyl ethers, and polyvinyl chlorides. The pyrrolidinone resins contemplated herein include poly(N-vinyl-2-pyrrolidinone). Representative trade materials of this kind are PVP K-60 resin, PVP/VA E335 resin, PVP/VA 1535 resin, and other resins sold by GAF Corporation. The polyols contemplated herein include polyvinyl alcohols. The polyvinyl alcohols contemplated herein include ELVANOL 90-50, ELVANOL HV, ELVANOL 85-80, and others.

Cationic resins and other materials contemplated for use herein as binding agents include polyethylenimine, methylaminoethyl resins, alkyl-trimethylammonium chlorides, and others. Esters of olefinic alcohols, aminoalkyl esters, esters of ether alcohols, cycloalkyl esters, and esters of halogenated alcohols are also contemplated for use as binding agents. Polyethylene oxides, such as materials available under the trade names NSR N-10, NSR N3000, and NSR 301 from Union Carbide Corp., are contemplated herein.

Still more binding agents contemplated herein include epoxy resins, cresol novolac resins, phenol novolac resins; epichlorohydrin resins; bisphenol resins; phenolic resins, such as DURITE AL-5801A resin available from Borden Packaging and Industrial Products of Louisville, Ky.; and natural resins and polymerizable materials such as damar, manila, rosin gum, rosin wood, rosin tall oil, and others.

A practical upper limit to the amount of binding agents used is contemplated to be that amount which materially interferes with the conductivity of the resulting conductive coatings by diluting the conductive solids in the composition after it is deposited as a film.

Dispersing Agent

Another component of some of the present compositions is an anionic dispersing agent. The anionic dispersing agent has a molecular weight less than about 1000 Daltons, so it is a substantially smaller molecule than the binding agent is.

The anionic dispersing agent has a hydrophobic end and a hydrophilic (anionic) end. It functions by surrounding the bound conductive particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound conductive particle has sufficient dispersing agent bound to it, the sphere of anionic charges surrounding each particle causes the particles to repel one another, and thus, to disperse.

The amount of anionic dispersing agent that is contemplated for the purposes of the present invention is an amount sufficient to cause the bound conductive particles to disperse in the aqueous dispersing medium. The amount of dispersing agent that is used is dependent upon the size of the conductive particle and the amount of binding agent bound thereto. As a general rule, smaller conductive particles require less dispersing agent than would be required to disperse larger particles.

To determine the amount of dispersing agent that is required in any particular case, one of ordinary skill in the art can begin by adding ever increasing amounts of dispersing agent to the bound conductive particles until a sufficient amount is added to cause the particles to disperse. This amount of dispersing agent is the minimum effective amount of dispersing agent. Increasing amounts of dispersing agent could be added without adversely affecting the dispersion of the conductive particles. To ensure that the particles remain dispersed, one could add a ten-percent greater amount of dispersing agent than is needed.

Thus, for purposes of the present invention, the amount of anionic dispersing agent that is used in the composition of the present invention is contemplated to be an amount that is effective for dispersing the bound conductive particles. For example, the anionic dispersing agent may be present as from about 0% to about 10% by weight of the composition. A practical upper limit to the amount of anionic dispersing agents used is contemplated to be that amount which materially interferes with the conductivity of the resulting conductive coatings by diluting the conductive solids in the composition after it is deposited as a film.

Suitable anionic dispersing agents include acrylic latices, aqueous solutions of alkali metal polyacrylates, and similar materials. Some of the previously defined binding agents of the present invention which have an anionic character are also contemplated to be suitable as the anionic dispersing agent herein.

Specific dispersing agents contemplated herein include ACRYSOL I-1955 and ACRYSOL I-545 dispersing agents, both of which are commercially available from the Rohm and Haas Co., Philadelphia, Pa. The ACRYSOL dispersing agents may be used alone or together, preferably together. A preferred weight ratio of ACRYSOL I-1955 to ACRYSOL I-545 is about 1:4.

Aqueous Dispersing Medium

Another component that may be present in the compositions of the present invention is an aqueous dispersing medium. The phrase, "aqueous dispersing medium," as used herein, includes any solvent that is from 80 to 100% water wherein the balance of the material is a water soluble composition. Typical water-soluble compositions include the low molecular weight alcohols, such as methanol, ethanol, and isopropanol. Additional solvents such as dimethylsulfoxide, tetrahydrofuran, and ethylene or propylene glycol may also be used. Alternatively, the aqueous dispersing medium may be 100% water. Deionized water is preferred.

The resulting composition is a carbon dispersion that is capable of depositing a uniform, low resistivity coating of carbon particles on the non-conductive surfaces of a through hole. The composition of the present invention may be used "as is," or it may be sold in concentrate form and then diluted up to tenfold (10:1), preferably up to fourfold (4:1), at the point of use. The composition may be diluted with an aqueous dispersing medium, which may include one or more of a buffer, a dispersing agent, a surfactant, or other ingredients.

Second Conductive Material

Another component of the composition of the present invention is a second conductive material (i.e. a conductive material including a conductive medium or surface other than elemental carbon). Conductive materials contemplated to be useful herein include activated carbon coated with copper, activated carbon coated with palladium, activated carbon coated with silver, nickel coated with silver, nickel, copper, alumina, aluminum, palladium, a powder comprised of tin oxide and antimony, or combinations of two or more of these materials.

The electrically conductive activated carbon coated with copper should be present in an amount effective to provide an improved electrically conductive coating when the composition is applied to a substrate. The activated carbon coated with copper may be present from about 0.05 to about 3.0% by weight, alternatively from about 0.1 to about 2.5% by weight, alternatively from about 0.5 to about 1.5% by weight, alternatively from about 1.0 to about 2.0% by weight, alternatively from about 1.5 to about 2.5% by weight of the composition. A suitable commercial source of activated carbon coated with copper includes Activated Carbon S-Sorb, sold by Calgon, Pittsburgh, Pa.

The electrically conductive activated carbon coated with palladium should be present in an amount effective to provide an improved electrically conductive coating when the composition is applied to a substrate. The activated carbon coated with palladium may be present from about 0.05 to about 3.0% by weight, alternatively from about 0.1 to about 2.5% by weight, alternatively from about 0.5 to about 1.5% by weight, alternatively from about 1.0 to about 2.0% by weight, alternatively from about 1.5 to about 2.5% by weight of the composition. A suitable commercial source of activated carbon coated with palladium includes E101 NE/W 20% palladium metal on activated carbon, sold by Degussa, Calvert City, Ky.

The electrically conductive activated carbon coated with silver should be present in an amount effective to provide an improved electrically conductive coating when the composition is applied to a substrate. The activated carbon coated with silver may be present from about 0.05 to about 3.0% by weight, alternatively from about 0.1 to about 2.5% by weight, alternatively from about 0.5 to about 1.5% by weight, alternatively from about 1.0 to about 2.0% by weight, alternatively from about 1.5 to about 2.5% by weight of the composition. A suitable commercial source of activated carbon coated with silver includes Activated Carbon F200 AG40, sold by Chemviron Carbon, Brussels, Belgium.

The electrically conductive nickel coated with silver should be present in an amount effective to provide an improved electrically conductive coating when the composition is applied to a substrate. The nickel coated with silver may be present from about 0.05 to about 3.0% by weight, alternatively from about 0.1 to about 2.5% by weight, alternatively from about 0.5 to about 1.5% by weight, alternatively from about 1.0 to about 2.0% by weight, alternatively from about 1.5 to about 2.5% by weight of the composition. A suitable commercial source of flakes of nickel coated with silver is Novamet, an Inco Company, Wyckoff, N.J.

The electrically conductive metals such as nickel, copper, alumina, aluminum, and palladium should be present in an amount effective to provide an improved electrically conductive coating when the composition is applied to a substrate. The metal may be present from about 0.05 to about 3.0% by weight, alternatively from about 0.1 to about 2.5% by weight, alternatively from about 0.5 to about 1.5% by weight, alternatively from about 1.0 to about 2.0% by weight, alternatively from about 1.5 to about 2.5% by weight of the composition.

A suitable commercial source of a powder comprised of tin oxide and antimony includes Zelec® ECP 3010 XC, sold by E. I. du Pont de Nemours and Company, Wilmington, Del. The electrically conductive powder comprised of tin oxide and antimony should be present in an amount effective to provide an improved electrically conductive coating when the composition is applied to a substrate. The powder comprised of tin oxide and antimony may be present from about 0.05 to about 3.0% by weight, alternatively from about 0.1 to about 2.5% by weight, alternatively from about 0.5 to about 1.5% by weight, alternatively from about 1.0 to about 2.0% by weight, alternatively from about 1.5 to about 2.5% by weight of the composition.

Electroplating Process

The present invention can be used for electroplating a conductive metal layer, such as copper, to the surface of a non-conductive material. This process is carried out by:
  a) preparing any of the conductive coatings of carbon and a second conductive material as described previously;
  b) applying the conductive coating to the non-conductive surface of a via or other non-conductive substrate;
  c) optionally, separating substantially all of the aqueous dispersing medium from the conductive coating, typically by drying the dispersion, so the conductive particles are deposited on the non-conductive surface in a substantially continuous layer; and
  d) electroplating a continuous metal layer over the conductive particles deposited on the non-conductive surface.

Descriptions of related processes which also involve cleaning, conditioning, and conductive coating steps and can be carried out according to the present invention (for two examples, the electroless copper and carbon black processes and another graphite conductive coating process) are found in cols. 1–4 of U.S. Pat. No. 5,476,580 and in cols. 1–4 of U.S. Pat. No. 5,139,642. These descriptions are hereby incorporated by reference herein in their entirety.

Process Lines

The present process can be carried out in a variety of equipment. Two common types of equipment are vertical or dip process equipment, in which the cleaners, conditioners, combined cleaner/conditioners, conductive dispersions, rinses, and other chemicals are provided in stationary baths into which the vertically-disposed boards are sequentially dipped, and conveyorized or horizontal equipment in which the boards are flooded or sprayed with the respective reagents while disposed and travelling substantially horizontally. Either type of equipment, or any combination of the two types of equipment, may be used within the scope of the present invention.

A board to be processed commonly is dip-processed in the cleaning solution for 4–6 minutes at 130° to 140° F. (54° to 60° C.). A board is commonly cleaned in a conveyorized process by flooding it at a similar temperature for a (usually) much shorter time such as 20 to 60 seconds. These conditions may need to be modified to suit a given situation.

A board to be processed commonly is dip-processed in the conditioning solution for 4–6 minutes at 130° to 140° F. (540 to 60° C.). A board is commonly conditioned in a conveyorized process by flooding it at a similar temperature for a (usually) much shorter time such as 20 to 60 seconds. These conditions may need to be modified to suit a given situation.

As an alternative to separate cleaning and/or conditioning steps, these two steps can be combined into one by consolidating their respective ingredients into a single formulation which both cleans and conditions the substrates. A typical cleaner/conditioner is used in the same manner, for about the same treatment time, at about the same treatment temperature, as an independent cleaner or conditioner.

Other steps, such as rinsing, may be interposed between the previously described steps at appropriate times.

Working Examples

The following examples are provided to describe specific embodiments of the invention and to demonstrate how it works. By providing those specific examples, the inventors do not limit the scope of the invention. The full scope of the invention is all the subject matter defined by the claims concluding this specification, and equivalents thereof.

EXAMPLES 1–3

Copper-clad printed wiring board coupons having a variety of vias was desmeared, cleaned, and conditioned. A 500-mL working bath of Electrochemicals Inc. SHADOW® II conductive graphite aqueous dispersion was made by diluting the dispersion as sold with water to 4% solids. Example 1 was a comparative example, for which the graphite dispersion does not include a second conductive material. The dilute graphite dispersion was coated on the printed wiring board coupon and fixed, dried, and microetched as recommended by Electrochemicals Inc. to prepare the coupon for electroplating. The coupon was electroplated with copper at 20 amperes per square foot for either 30 seconds or 2 minutes. See Table 1.

The through hole wall of Example 1 was examined by backlight testing the coupon vias for plating defects. The plating sample was rated in percent coverage, where 100% represents the best via plating with no discemable defects. At the same time, the sample was evaluated directly for resistivity. For these evaluations, lower resistivity represents better plating uniformity. The results are set out in Example 1 of Table 2.

Example 2 was carried out like Example 1, except that a powder of tin oxide and antimony (Zelec® ECP 3010 XC) was added to the diluted SHADOW® II graphite dispersion. The dispersion was immediately applied to the coupon and the remaining steps defined in Example 1 were carried out. Example 3 was carried out like Example 2, except that activated carbon coated with palladium was added to the diluted SHADOW® II graphite dispersion.

The results of Examples 1–3 are presented in Table 2. Looking first at Examples 1 (control—no added conductive material), 2 (added a powder comprised of tin oxide and antimony), and 3 (added activated carbon coated with palladium) where the coupons were plated for 30 seconds, the backlight score improved from 50 for Example 1 to 80 for Examples 2 and 3. Where the coupons were plated for two minutes the back light score improved from 90 for Example 1 to 98 for Example 2. Similarly, from Example 1 to Examples 2 and 3 the resistivity decreased dramatically. These test results confirm that adding a second conductive material to the graphite dispersion improves vias conductivity and coating uniformity.

TABLE 1

The process

| Steps | Time (min.) | Temperature (° F.) |
| --- | --- | --- |
| 1. Cleaner/Conditioner with Ultrasound | 5 | 130 |
| 2. Rinse | 1 | Room Temp. |

TABLE 1-continued

The process

| Steps | Time (min.) | Temperature (° F.) |
| --- | --- | --- |
| 3. Shadow II plus Additive(s) | 5 | Room Temp. |
| 4. Fixer | 30 sec. | 125 |
| 5. Rinse | 30 sec. | Room Temp. |
| 6. Oven Dry | 15 | 190 |
| 7. Measure Resistivity | — | — |
| 8. Microetch | 1 | Room Temp. |
| 9. Rinse | 1 | Room Temp. |
| 10. Acid Cleaner | 3 | 115 |
| 11. Rinse | 1 | Room Temp. |
| 12. Microetch | 30 sec. | Room Temp. |
| 13. Rinse | 1 | Room Temp. |
| 14. Sulfuric Acid | 30 sec. | Room Temp. |
| 15. Copper Plating | 30 sec. or 2 min. | Room Temp. |
| 16. Oven Dry | 5 | 190 |
| 17. Back Light Evaluation | — | — |

TABLE 2

Resistivity and Back Light Test Results.

| Test | Percent Coverage After Copper Plating for 30 Seconds | Percent Coverage After Copper Plating for 2 Minutes | Resistivity (Ω) |
| --- | --- | --- | --- |
| Example 1. Shadow II only | 50% | 90% | 75 |
| Example 2. Shadow II plus tin oxide and antimony | 80% | 98% | 49 |
| Example 3. Shadow II plus activated carbon coated with palladium | 80% | 90% | 46 |

EXAMPLES 4–9

Copper-clad printed wiring board coupons having a variety of vias was desmeared, cleaned, and conditioned. A 500-mL working bath of Electrochemicals Inc. SHADOW® II conductive graphite aqueous dispersion was made by diluting the dispersion as sold with water to 5% solids. Example 4 was a comparative example, for which the graphite dispersion does not include a second conductive material. The dilute graphite dispersion was coated on the printed wiring board coupon and fixed, dried, and microetched as recommended by Electrochemicals Inc. to prepare the coupon for electroplating. The coupon was then electroplated with copper at 25 amperes per square foot for 10 minutes.

The coupons of Example 4 were then subjected to a hot oil test to mimic the soldering process and then examined for blowholes. The coupons were rated in percent blowholes, where 0% represents the best via plating with no blowhole defects. The results are set out in Example 4 of Table 3.

Example 5 was carried out like Example 4, except that activated carbon coated with palladium was added to the diluted SHADOW® II graphite dispersion. The dispersion was immediately applied to the coupon and the remaining steps defined in Example 4 were carried out. Example 6 was carried out like Example 5, except that activated carbon coated with copper was added to the diluted SHADOW® II graphite dispersion. Example 7 was carried out like Example 5, except that activated carbon coated with silver was added to the diluted SHADOW® II graphite dispersion. Example 8 was carried out like Example 5, except that a powder of tin oxide and antimony (Zelec® ECP 3010 XC) was added to the diluted SHADOW® II graphite dispersion activated carbon coated with palladium Example 9 was carried out like Example 5, except that alumina powder was added to the diluted SHADOW® II graphite dispersion.

The results of Examples 4–9 are presented in Table 3. Looking first at Example 4, the control—no added conductive material, 3–5% of the vias formed blowholes when subjected to the hot oil test. In contrast, Examples 5 (added activated carbon coated with palladium), 7 (added activated carbon coated with silver), and 8 (added a powder comprised of tin oxide and antimony) evidenced a dramatic decrease in the percent of blowholes formed during the hot oil test. These test results confirm that adding a second conductive material to the graphite dispersion significantly reduces blowhole formation.

TABLE 3

Hot Oil Test Results.

|  | Percent Blowholes Coupon No. 1 | Percent Blowholes Coupon No. 2 |
| --- | --- | --- |
| Example 4. Shadow II only | 3% | 5% |
| Example 5. Shadow II plus Activated Carbon Coated with Palladium | 0% | 0% |
| Example 6. Shadow II plus Activated Carbon Coated with Copper | 1.5% | 3% |
| Example 7. Shadow II plus Activated Carbon Coated with Silver | 0% | 1% |
| Example 8. Shadow II plus Tin Oxide and Antimony | 0% | 0% |
| Example 9. Shadow II plus Alumina | 1.5% | 0% |

What is claimed is:

1. A composition comprising:
   A. from about 0.1 to about 25% by weight of the composition of electrically conductive graphite particles; and
   B. from about 0.01 to about 4% of a second conductive material that is particulate tin oxide and antimony,
   wherein said graphite particles and said second conductive material are present in amounts effective to provide an opaque coating.

2. The composition of claim 1 wherein a water dispersible binding agent is present as from about 0.2% to about 20% by weight of the composition.

3. The composition of claim 1 wherein a dispersing agent is present as from about 0% to about 10% by weight of the composition.

4. The composition of claim 1 wherein said graphite particles are present as from about 0.1 to about 20% by weight of the composition.

5. The composition of claim 1 wherein said graphite particles are present as from about 0.5 to about 10% by weight of the composition.

6. The composition of claim 1 wherein said graphite particles are present as from about 1 to about 7% by weight of the composition.

7. The composition of claim 1 wherein said graphite particles are present as from about 4 to about 6.5% by weight of the composition.

8. The composition of claim 1 wherein said particulate tin oxide and antimony is present as from about 0.05 to about 3.0% by weight of the composition.

9. The composition of claim 1 wherein said particulate tin oxide and antimony is present as from about 0.1 to about 2.5% by weight of the composition.

10. The composition of claim 1 wherein said particulate tin oxide and antimony is present as from about 0.5 to about 1.5% by weight of the composition.

11. The composition of claim 1 wherein said particulate tin oxide and antimony is present as from about 1.0 to about 2.0% by weight of the composition.

12. The composition of claim 1 wherein said particulate tin oxide and antimony is present as from about 1.5 to about 2.5% by weight of the composition.

13. A composition comprising:
   A. from about 0.1 to about 25% by weight of the composition of electrically conductive carbon particles; and
   B. from about 0.01 to about 4% of a second conductive material that is activated carbon coated with copper,
   wherein said carbon particles and said second conductive material are present in amounts effective to provide an opaque coating.

14. The composition of claim 13, wherein said electrically conductive carbon particles comprise graphite.

15. The composition of claim 13, further comprising a water dispersible binding agent, present as from about 0.2% to about 20% by weight of the composition.

16. The composition of claim 13, wherein said carbon particles are present as from about 0.1 to about 20% by weight of the composition.

17. The composition of claim 13 wherein said carbon particles are present as from about 0.5 to about 10% by weight of the composition.

18. The composition of claim 13 wherein said carbon particles are present as from about 1 to about 7% by weight of the composition.

19. The composition of claim 13 wherein said carbon particles are present as from about 4 to about 6.5% by weight of the composition.

20. The composition of claim 13, wherein said activated carbon coated with copper is present as from about 0.05 to about 3.0% by weight of the composition.

21. The composition of claim 13, wherein said activated carbon coated with copper is present as from about 0.1 to about 2.5% by weight of the composition.

22. The composition of claim 13, wherein said activated carbon coated with copper is present as from about 0.5 to about 1.5% by weight of the composition.

23. The composition of claim 13, wherein said activated carbon coated with copper is present as from about 1.0 to about 2.0% by weight of the composition.

24. The composition of claim 13, wherein said activated carbon coated with copper is present as from about 1.5 to about 2.5% by weight of the composition.

25. A composition comprising:
   A. from about 0.1 to about 25% by weight of the composition of electrically conductive carbon particles; and
   B. from about 0.01 to about 4% of a second conductive material that is activated carbon coated with palladium;
   wherein said carbon particles and said second conductive material are present in amounts effective to provide an opaque coating.

26. The composition of claim 25, wherein said electrically conductive carbon particles comprise graphite.

27. The composition of claim 25, further comprising a water dispersible binding agent, present as from about 0.2% to about 20% by weight of the composition.

28. The composition of claim 25, wherein said carbon particles are present as from about 0.1 to about 20% by weight of the composition.

29. The composition of claim 25 wherein said carbon particles are present as from about 0.5 to about 10% by weight of the composition.

30. The composition of claim 25 wherein said carbon particles are present as from about 1 to about 7% by weight of the composition.

31. The composition of claim 25, wherein said carbon particles are present as from about 4 to about 6.5% by weight of the composition.

32. The composition of claim 25, wherein said activated carbon coated with palladium is present as from about 0.05 to about 3.0% by weight of the composition.

33. The composition of claim 25, wherein said activated carbon coated with palladium is present as from about 0.1 to about 2.5% by weight of the composition.

34. The composition of claim 25, wherein said activated carbon coated with palladium is present as from about 0.5 to about 15% by weight of the composition.

35. The composition of claim 25, wherein said activated carbon coated with palladium is present as from about 1.0 to about 2.0% by weight of the composition.

36. The composition of claim 25, wherein said activated carbon coated with palladium is present as from about 1.5 to about 2.5% by weight of the composition.

37. A composition comprising:
   A. from about 0.1 to about 25% by weight of the composition of electrically conductive graphite particles; and
   B. from about 0.01 to about 4% of a second conductive material that is activated carbon coated with silver; wherein said graphite particles and said second conductive material are present in amounts effective to provide an opaque coating.

38. The composition of claim 37, further comprising a water dispersible binding agent, present as from about 0.2% to about 20% by weight of the composition.

39. The composition of claim 37, wherein said graphite particles are present as from about 0.1 to about 20% by weight of the composition.

40. The composition of claim 37, wherein said graphite particles are present as from about 0.5 to about 10% by weight of the composition.

41. The composition of claim 37, wherein said graphite particles are present as from about 1 to about 7% by weight of the composition.

42. The composition of claim 37, wherein said graphite particles are present as from about 4 to about 6.5% by weight of the composition.

43. The composition of claim 37, wherein said activated carbon coated with silver is present as from about 0.05 to about 3.0% by weight of the composition.

44. The composition of claim 37, wherein said activated carbon coated with silver is present as from about 0.1 to about 2.5% by weight of the composition.

45. The composition of claim 37, wherein said activated carbon coated with silver is present as from about 0.5 to about 1.5% by weight of the composition.

46. The composition of claim 37, wherein said activated carbon coated with silver is present as from about 1.0 to about 2.0% by weight of the composition.

47. The composition of claim 37, wherein said activated carbon coated with silver is present as from about 1.5 to about 2.5% by weight of the composition.

* * * * *